(12) United States Patent
Watanabe

(10) Patent No.: US 7,924,380 B2
(45) Date of Patent: Apr. 12, 2011

(54) SEMICONDUCTOR LIGHT-RECEIVING DEVICE

(75) Inventor: Sawaki Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 94 days.

(21) Appl. No.: 12/521,940

(22) PCT Filed: Jan. 17, 2008

(86) PCT No.: PCT/JP2008/050529
§ 371 (c)(1),
(2), (4) Date: Jul. 1, 2009

(87) PCT Pub. No.: WO2008/088018
PCT Pub. Date: Jul. 24, 2008

(65) Prior Publication Data
US 2010/0044818 A1   Feb. 25, 2010

(30) Foreign Application Priority Data

Jan. 18, 2007   (JP) .................................. 2007-009186

(51) Int. Cl.
*G02F 1/1333* (2006.01)

(52) U.S. Cl. ............. 349/122; 349/56; 349/84; 349/123; 257/428; 257/431; 257/432; 257/435; 257/436; 257/E31.127

(58) Field of Classification Search ...................... 349/56, 349/84, 122, 123; 257/414, 428, 431, 432, 257/435, 436
See application file for complete search history.

(56) References Cited

U.S. PATENT DOCUMENTS 6,661,485 B2 * 12/2003 Moon ............................ 349/113
6,909,083 B2 *  6/2005 Matsuda ..................... 250/214.1

FOREIGN PATENT DOCUMENTS

| JP | 1996032105 A | 2/1996 |
| JP | 1996181350 A | 7/1996 |
| JP | 2001028454 A | 1/2001 |
| JP | 2001085729 A | 3/2001 |
| JP | 2003243693 A | 8/2003 |
| JP | 2004047728 A | 2/2004 |
| JP | 2004241588 A | 8/2004 |
| JP | 2005101113 A | 4/2005 |
| JP | 2005108955 A | 4/2005 |

OTHER PUBLICATIONS

International Search Report for PCT/JP2008/050529 mailed Feb. 19, 2008.

* cited by examiner

*Primary Examiner* — Jennifer Doan

(57) ABSTRACT

Disclosed is light-receiving device (1) comprising semiconductor substrate (101), a light-receiving layer arranged on semiconductor substrate (101), and filter layer (103) arranged between semiconductor substrate (101) and the light-receiving layer to absorb light other than reception light. First mesa (11) serving as the light-receiving layer is surrounded by third mesa (13) for absorbing at least light other than reception light. Consequently, even when filter layer (103) is too thin to sufficiently absorb light other than reception light, third mesa (13) absorbs the light, thereby preventing the light from reaching first mesa (11).

18 Claims, 4 Drawing Sheets

_US 7,924,380 B2_

SEMICONDUCTOR LIGHT-RECEIVING DEVICE

SEMICONDUCTOR LIGHT-RECEIVING DEVICE

This application is the National Phase of PCT/JP2008/050529, filed Jan. 17, 2008, which claims a priority based on Japanese Patent Application No. 2007-009186 filed on Jan. 18, 2007, the entire contents of which are incorporated herein by reference.

TECHNICAL FIELD

The present invention relates to a semiconductor light-receiving device having a function of shielding light other than reception light.

BACKGROUND ART

With explosive increase of a demand for a broadband multimedia communication service such as internet, it is necessary to develop a larger capacity and higher function optical fiber communication system. The number of optical communication modules used in such a large-scaled system increases due to a large scale tendency of the system. Costs and mounting loads in the overall system including the size of the optical communication module are not ignorable any more. Therefore, miniaturization, function integration and low costs of the optical communication module become very important tasks.

Particularly, as a method for implementing an optical subscriber system such as a Fiber To The Home (FTTH), a single core bidirectional light transmission/reception module where a light signal function of sending a signal and a light reception function are integrated on one optical platform is expected as an optical integration technology that can be possibly brought into practical use in terms of miniaturization and low cost.

FIG. 8 shows a conceptual view of the single core bidirectional light transmission/reception module. Optical fiber 82 is arranged on silicon platform 81, and semiconductor laser 83 for outputting a signal light having a wavelength of e.g. 1.3 μm is fixed to a front end of optical fiber 82. Wavelength Division Multiplex (WDM) filter 84 is installed along optical fiber 82, and light-receiving device 85 for a reception signal is fixed just above WDM filter 84. An output of semiconductor laser 83 becomes light λ2 transmitted to the outside via optical fiber 82. Reception light λ1 incident from the outside via optical fiber 82 is normally signal light having a longer wavelength than that of transmission light λ2, e.g. a wavelength of 1.5 μm, reflected by WDM filter 84, incident on light-receiving device 85, and detected by a light-receiving portion.

In the single core bidirectional light transmission/reception module with the above construction, since transmission and reception devices are accommodated in one package adjacently to each other for package miniaturization, various scattered light is generated in the module by transmission light λ2. Therefore, light other than light to be received, such as the scattered light, intrudes into light-receiving device 85, to thereby cause optical crosstalk. It is thus necessary to restrict the optical crosstalk. Accordingly, a countermeasure is conducted, arranging a high sensitivity filter at a front end of light-receiving device 85 to selectively transmit light λ1 to be received.

However, in the related art, when the WDM filter is provided with high sensitivity, the cost increases, and when a band-pass filter is used in addition to the WDM filter, the number of components increases. Such increase of the number of the components undesirably results in increase of the cost and size of the module.

The light-receiving devices are classified into a rear face incident type light-receiving device where reception light is incident from a semiconductor substrate side to a light-receiving layer stacked on the semiconductor substrate, and an end face incident type light-receiving device where an electrode is arranged at a portion of a mesa-structure semiconductor waveguide as a light-receiving portion to receive light incident from a mesa end face. Also, known is a surface incident type light-receiving device where a multiple reflection layer is arranged on a semiconductor substrate, and a light-receiving layer is formed thereon, such that incident light from the light-receiving layer side is reflected by the multiple reflection layer and received by the light-receiving layer.

Known rear face incident type light-receiving devices are a planar type light-receiving device and a mesa type light-receiving device. In addition, there are a structure where electrodes forming a pair are arranged on a light incident side and an opposite side, respectively, and a structure where electrodes are arranged merely on an opposite side to a light incident side. A known mesa type light-receiving device is a flip chip mountable device where a second electrode is extended or formed on a mesa specially arranged with the same height as that of a first electrode arranged on a light-receiving portion mesa structure (e.g. refer to Drawings 3 and 4 of Patent Document 1).

In order to reduce optical crosstalk without increasing the number of components, suggested is a rear face incident type light-receiving device where a light absorption layer (filter layer) having a shorter absorption edge wavelength than that of a light-receiving layer is arranged between a light incident side substrate and the light-receiving layer, such that the filter layer absorbs short wavelength light causing the optical crosstalk, and the light-receiving layer selectively receives only long wavelength light (e.g. Patent Documents 2 to 5). However, so as to sufficiently absorb the short wavelength light causing the optical crosstalk, it is necessary to form the filter layer with a thick film or increase a concentration of impurity. Such countermeasures may degrade crystallinity. Moreover, the filter layer formed of the thick film reduces light to be received, which may lead to low reliability.

According to Patent Document 6, in a rear face incident type light-receiving device, a pn junction is formed in a region other than a light-receiving portion, and light incident from a side face of the light-receiving device is absorbed by a depletion layer formed by the pn junction formed around the light-receiving portion, such that the light is prevented from reaching the light-receiving portion (Refer to Drawing 2 and Paragraphs 0024 and 0041 to 0047). In addition, Drawing 3 of the document shows a construction where a light-receiving portion is formed like a mesa, and a metal light shielding layer is formed on a side face of the mesa, such that the metal light shielding layer shields incident light from the side face of the mesa.

Patent Document 1: Japanese Laid-Open Patent Publication HEI 8-32105 (Drawings 3 and 4)
Patent Document 2: Japanese Laid-Open Patent Publication 2001-28454
Patent Document 3: Japanese Laid-Open Patent Publication 2001-85729
Patent Document 4: Japanese Laid-Open Patent Publication 2003-243693
Patent Document 5: Japanese Laid-Open Patent Publication 2005-101113

Patent Document 6: Japanese Laid-Open Patent Publication 2004-241588 (Drawings 2 and 3)

DISCLOSURE OF THE INVENTION

Problems to be Solved by the Invention

An object of the present invention is to provide a light-receiving device capable of solving the foregoing problems and reducing optical crosstalk.

Means for Solving the Problems

A semiconductor light-receiving device of the present invention capable of solving the foregoing problems and reducing optical crosstalk, comprises a semiconductor substrate, and a first conductive type semiconductor layer, a second conductive type semiconductor layer including at least a light absorption layer, a first conductive type electrode formed on the first conductive type semiconductor layer, and a second conductive type electrode formed on the second conductive type semiconductor layer, which are formed on the semiconductor substrate, signal light incident from the semiconductor substrate being absorbed by the light absorption layer and converted into an electric signal, the semiconductor light-receiving device comprising a filter layer arranged between the semiconductor substrate and the light absorption layer, and formed of a semiconductor layer having a shorter absorption edge wavelength than that of the light absorption layer, the second conductive type electrode being formed on a first mesa where a semiconductor layer on the filter layer is formed in a mesa structure, the semiconductor light-receiving device comprising a third mesa surrounding the first mesa, disposed spaced apart from the first mesa, and absorbing disturbance light to the signal light to be received by at least the light absorption layer.

In addition, the first conductive type electrode is extended and formed on a second mesa formed outside the third mesa with respect to the first mesa.

The third mesa has the same semiconductor layer structure as that of the first mesa, or is formed including a semiconductor layer having a shorter absorption edge wavelength than that of the light absorption layer.

A light shielding film is formed on a sidewall of the third mesa, or an insulation film for absorbing or reflecting light incident on the first mesa through the medium of the third mesa is filled in a gap between the first mesa and the third mesa.

Here, when the third mesa is disposed surrounding the first mesa, the first mesa may be formed in an unbroken ring shape or a partially broken ring shape. Moreover, the third mesa may include a plurality of mesa portions, and the plurality of mesa portions may be disposed surrounding the first mesa. That is, a planar center of the first mesa preferably exists in a region surrounded by the third mesa.

ADVANTAGES OF THE INVENTION

According to the present invention, with respect to light disturbing the reception, the filter layer having a sufficient absorption coefficient is arranged at the front end of the light-receiving layer, to thereby absorb light generated by scattering or the like other than light to be received. In addition, with respect to light passing through the filter layer other than light to be received, the third mesa is disposed surrounding the first mesa, to thereby prevent light disturbing the reception or light generated by scattering or the like from reaching a light-receiving region (first mesa). The semiconductor layer in the third mesa, particularly, the semiconductor layer with the same composition as that of the light absorption layer or the filter layer in the first mesa can absorb light generated by scattering or the like.

Moreover, since the first conductive type electrode is extended and formed on the second mesa formed outside the third mesa with respect to the first mesa, it is possible to obtain a flip chip mountable light-receiving device.

Further, the light shielding layer is arranged on the sidewall of the third mesa or the insulation film is formed in the gap between the first mesa and the second mesa, which is more advantageous in reducing the crosstalk.

As described so far, it is possible to provide the semiconductor light-receiving device reducing the crosstalk.

EXPLANATION OF REFERENCE NUMERALS

Figure 1:
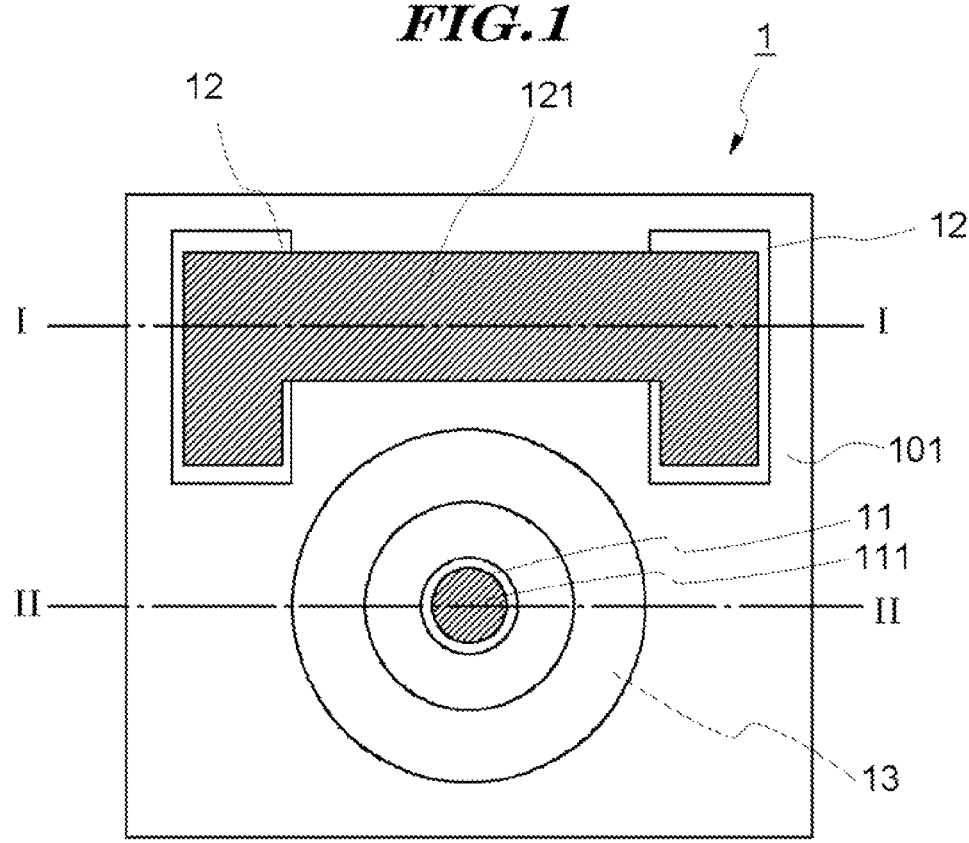
FIG. 1 is a plane view illustrating a light-receiving device according to a first exemplary embodiment of the present invention.

1: Light-receiving device
2: Light-receiving device
3: Light-receiving device
11: First mesa
12: Second mesa
13: Third mesa
21: Light shielding layer
23: Third mesa
31: Insulation material
81: Silicon substrate
82: Optical fiber
83: Semiconductor layer
84: WDM filter
85: Light-receiving device
101: Semiconductor substrate
102: Buffer layer
103: Filter layer
104: Multiplication layer
105: Electric field mitigation layer
106: Light absorption layer
107: Contact layer
108: Protection film
109: Antireflection film
111: p-Side electrode
121: n-Side electrode

BEST MODE FOR CARRYING OUT THE INVENTION

Hereinafter, exemplary embodiments of the present invention will be explained with reference to the drawings. Same reference numerals are used for same components in the whole drawings, and explanations thereof are appropriately omitted. Also, in the following description, although a first conductive type is defined as n type and a second conductive type is defined as p type, they can be constructed vice versa. In addition, a semiconductor layer (intrinsic layer, I layer) which is not doped with impurity ions may be interposed between both conductive layers.

First Exemplary Embodiment

Figure 2:
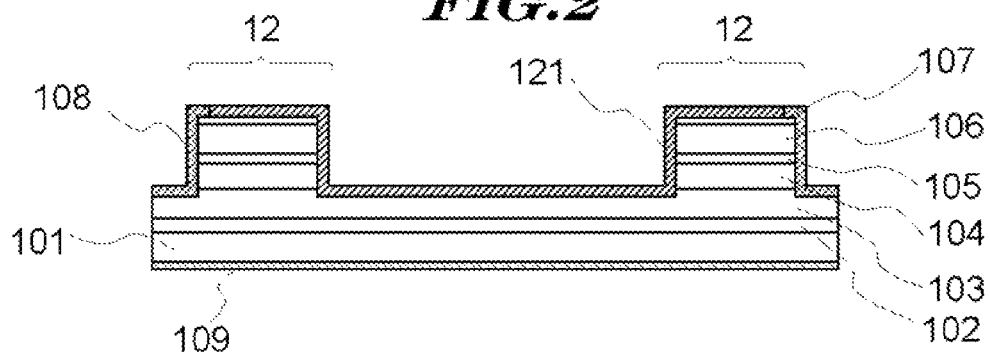
FIG. 2 is a sectional view taken in I-I direction of FIG. 1.
Figure 3:
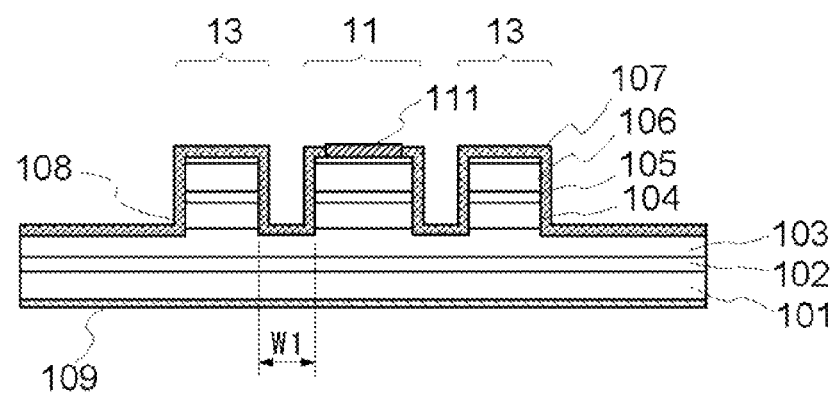
FIG. 3 is a sectional view taken in II-II direction of FIG. 1.

FIGS. 1 to 3 illustrate semiconductor light-receiving device 1 according to the present invention. FIG. 1 is a plane view of light-receiving device 1, FIG. 2 is a sectional view taken in I-I direction of FIG. 1, and FIG. 3 is a sectional view taken in II-II direction of FIG. 1.

First of all, light-receiving device 1 will be briefly explained.

Light-receiving device 1 includes semiconductor substrate 101, first mesa 11 provided with a light-receiving region arranged on semiconductor substrate 101 and first electrode (p-side electrode) 111 formed on the light-receiving region, second mesa 12 arranged on semiconductor substrate 101 and provided with a semiconductor layer and second electrode (n-side electrode) 121 arranged on the semiconductor layer, and third mesa 13 arranged on semiconductor substrate 101 and provided with a semiconductor layer. Third mesa 13 is arranged surrounding first mesa 11.

Hereinafter, light-receiving device 1 will be explained in detail.

Light-receiving device 1 includes semiconductor substrate 101, and semiconductor layers stacked on semiconductor substrate 101.

Semiconductor substrate 101 is e.g. InP substrate. Antireflection film 109 is arranged on a rear face of semiconductor substrate 101.

As illustrated in FIG. 2, the semiconductor layers are obtained by successively stacking buffer layer 102, filter layer 103, multiplication layer 104, electric field mitigation layer 105, light absorption layer (light-receiving region) 106 and contact layer 107 on semiconductor substrate 101.

Buffer layer 102 is e.g. $n^+$ type InP buffer layer.

Filter layer 103 is a layer having a larger bandgap than that of light absorption layer 106. For example, filter layer 103 is quaternary mixed crystal n-type InGaAlAs layer or n-type InGaAsP layer having a mixed crystal ratio where bandgap wavelength λg is an intermediate value (λ1<λg<λ2) between light λ1 to be received and light λ2 disturbing the reception.

Here, a thickness of the filter layer is not less than 0.1 μm and a carrier concentration thereof is not less than $1×10^{17}$ $cm^{-3}$, which are preferably set to prevent degradation of crystallinity. In this exemplary embodiment, for example, a thickness of n-type InGaAlAs layer or n-type InGaAsP layer is 1 μm and a carrier concentration thereof is $5×10^{18}$ $cm^{-3}$.

Multiplication layer 104 causes avalanche multiplication via application of a high electric field to generate a large volume of carriers. Multiplication layer 104 is e.g. undoped InAlAs layer.

Electric field mitigation layer 105 is a layer arranged to mitigate a difference between the high electric field applied to multiplication layer 104 and a comparatively low electric field applied to light absorption layer 106.

When this layer is arranged, it is possible to stably apply a high electric field to multiplication layer 104. Exemplary electric field mitigation layer 105 is p-type InP layer or InAlAs layer.

Light absorption layer 106, which is a layer serving to convert incident light into electricity, has a sufficient bandgap to absorb light λ1 to be received. Light absorption layer 106 is equivalent to I layer, and e.g. undoped InGaAs layer.

Contact layer 107 is e.g. $p^+$ type InGaAs layer.

A plurality of mesas (first mesa 11, second mesa 12 and third mesa 13) having respective layers 102 to 107 are formed on semiconductor substrate 101 of light-receiving device 1, which will be discussed later in detail. Each mesa 11 to 13 is formed by stacking respective layers 102 to 107 and etching them.

Here, first mesa 11, second mesa 12 and third mesa 13 are disposed spaced apart from each other, and arranged independently.

As illustrated in FIGS. 1 and 3, first mesa 11 is formed approximately in a cylindrical shape. First mesa 11 includes respective layers 102 to 107, and p-side electrode 111 arranged on contact layer 107. Light absorption layer 106 of first mesa 11 is a light-receiving region.

Width dimension of first mesa 11 (width dimension in a direction orthogonal to a protruding direction of first mesa 11, here, a diameter of first mesa 11) ranges from e.g. 20 μm to 30 μm.

p-Side electrode 111 is a stacked electrode containing e.g. Au.

As illustrated in FIGS. 1 and 2, second mesa 12 is arranged in a plural number (two in this exemplary embodiment), and formed in e.g. a quadrangular column shape.

Respective second mesas 12 are formed in positions spaced apart from first mesa 11 by a certain distance.

In addition, two second mesas 12 are disposed to face each other.

n-Side electrode 121 is formed on contact layers 107 of respective second mesas 12 and buffer layer 102 between respective second mesas 2. Here, buffer layer 102 or filter layer 103 becomes an n-side contact face. n-Side electrode 121 is formed by stepped wiring. n-Side electrode 121 is also a stacked electrode containing e.g. Au.

Here, an area of a top portion of second mesa 12 is larger than an area of a top portion of first mesa 11.

Second mesa 12 and first mesa 11 are connected through the medium of buffer layer 102 or filter layer 103 which is a conductive layer.

As illustrated in FIGS. 1 and 3, third mesa 13 is formed in a ring shape, surrounding first mesa 11.

Third mesa 13 unbrokenly and continuously surrounds the circumference of first mesa 11. A portion of third mesa 13 is positioned between first mesa 11 and second mesas 12.

Distance W1 between third mesa 13 and first mesa 11 preferably ranges from 20 μm to 30 μm, but may be smaller. Like this exemplary embodiment, third mesa 13 is preferably formed in a circular ring shape, unbrokenly and continuously surrounding the circumference of first mesa 11. However, the present invention is not limited thereto. For example, a third mesa may be formed in a quadrangular ring shape.

Protection film 108 is formed on a top portion and sidewall of third mesa 13, a surface of buffer layer 102 around mesas 11 to 13, a sidewall of first mesa 11, and a sidewall of second mesa 12. Protection film 108 is an insulation film, e.g. a silicon nitride film.

Light-receiving device 1 introduces light from a rear face side of semiconductor substrate 101, and absorbs incident light through light absorption layer 106, to thereby generate pairs of electrons and holes as carriers.

The holes reach p-side electrode 111 through the medium of contact layer 107, and the electrons reach n-side electrode 121 through the medium of buffer layer 102 or filter layer 103.

Meanwhile, in light-receiving device 1, the first electrode and the second electrode are disposed on a same face, and formed in a structure corresponding to flip chip mounting.

Next, a method for manufacturing light-receiving device 1 will be explained.

First of all, buffer layer 102, filter layer 103, multiplication layer 104, electric field mitigation layer 105, light absorption layer 106 and contact layer 107 are successively stacked on semiconductor substrate 101 by gas source Molecular Beam Epitaxy (MBE).

Then, respective layers 102 to 107 are selectively removed by etching, such that first mesa 11, second mesa 12 and third mesa 13 are formed. The etching is performed until a portion of buffer layer 102 or filter layer 103 is etched.

After the completion of the etching process, first mesa 11, second mesa 12 and third mesa 13 have an approximately identical height dimension.

Next, protection film 108 is formed on a surface of light-receiving device 1. Protection film 108 is formed covering sidewalls and top portions of respective mesas 11 to 13, and buffer layer 102 or filter layer 103 exposed around respective mesas 11 to 13.

Thereafter, the portions of protection film 108 formed on the top portion of first mesa 11, the top portions of the pair of second mesas 12, and buffer layer 102 or filter layer 103 between the pair of second mesas 12 are selectively removed by etching. Here, for example, hydrofluoric acid is used as an etching solution.

Next, p-side electrode 111 and n-side electrode 121 are formed on protection film 108—removed portions, respectively. Concretely, aside electrode 111 is formed on the top portion of first mesa 11, and n-side electrode 121 is formed on the top portions of second mesas 12 and buffer layer 102 or filter layer 103 between the pair of second mesas 12. n-Side electrode 121 is formed by stepped wiring.

Finally, a rear face of semiconductor substrate 101 is mirror-polished such that antireflection film 109 is formed thereon. Therefore, light-receiving device 1 is brought into completion.

Hereinafter, effects of the present invention will be explained.

In this exemplary embodiment, light is incident from the rear face of semiconductor substrate 101. Here, the incident light reaches light absorption layer 106 via filter layer 103. In a case where the incident light includes light λ2 disturbing the reception as well as light λ1 to be received, since filter layer 103 has a sufficient absorption coefficient for light λ2 disturbing the reception, it absorbs light λ2 disturbing the reception, and transmits light λ1 to be received. Accordingly, it is possible to prevent light λ2 disturbing the reception from reaching light absorption layer 106.

Also, when a thickness of filter layer 103 is increased, it can improve an absorption effect. However, as described above, a thick film may cause degradation of crystallinity. It is thus difficult to completely absorb light by filter layer 103.

Therefore, in this exemplary embodiment, third mesa 13 is formed in a ring shape surrounding first mesa 11. For example, when filter layer 103 is thin such that it does not sufficiently absorb light λ2 disturbing the reception but transmits some of light λ2, since light absorption of light absorption layer 106 of third mesa 13 serves as a capture region of disturbance light λ2 and contributes to a filtering effect, it is possible to more prevent light from reaching the light-receiving region of first mesa 11.

In this exemplary embodiment, since third mesa 13 is formed in an unbroken ring shape, even if scattered light is introduced into semiconductor substrate 101 of light-receiving device 1 from different directions, light absorption layer 106 of third mesa 13 can be a capture region of the scattered light. Consequently, it is possible to restrict crosstalk of light-receiving device 1.

In addition, in this exemplary embodiment, although third mesa 13 has the same crystal layer structure as that of first mesa 11, if third mesa 13 is formed of a crystal layer having a sufficient absorption coefficient for light λ2 disturbing the reception by a method including selective growth or the like (e.g., if third mesa 13 is formed including a semiconductor layer having a shorter absorption edge wavelength than that of the light absorption layer like the filter layer), it is possible to provide a light-receiving device more restricting crosstalk.

Moreover, in this exemplary embodiment, contact of the second electrode may be any of buffer layer 102 and filter layer 103. Filter layer 103 can more increase doping concentration than buffer layer 102, which is advantageous in reducing a contact resistance of the second electrode.

For example, in this exemplary embodiment, although the third mesa is formed in a ring shape surrounding the circumference of the first mesa, the present invention is not limited thereto. The third mesa may include a plurality of mesa portions surrounding the circumference of first mesa 11. However, when an incident direction of scattered light is unknown, it is preferable to use an annular third mesa with a discontinuity at a portion to prevent transmission of the scattered light.

Second Exemplary Embodiment

The second exemplary embodiment will be explained with reference to FIGS. 4 and 5.

Figure 4:
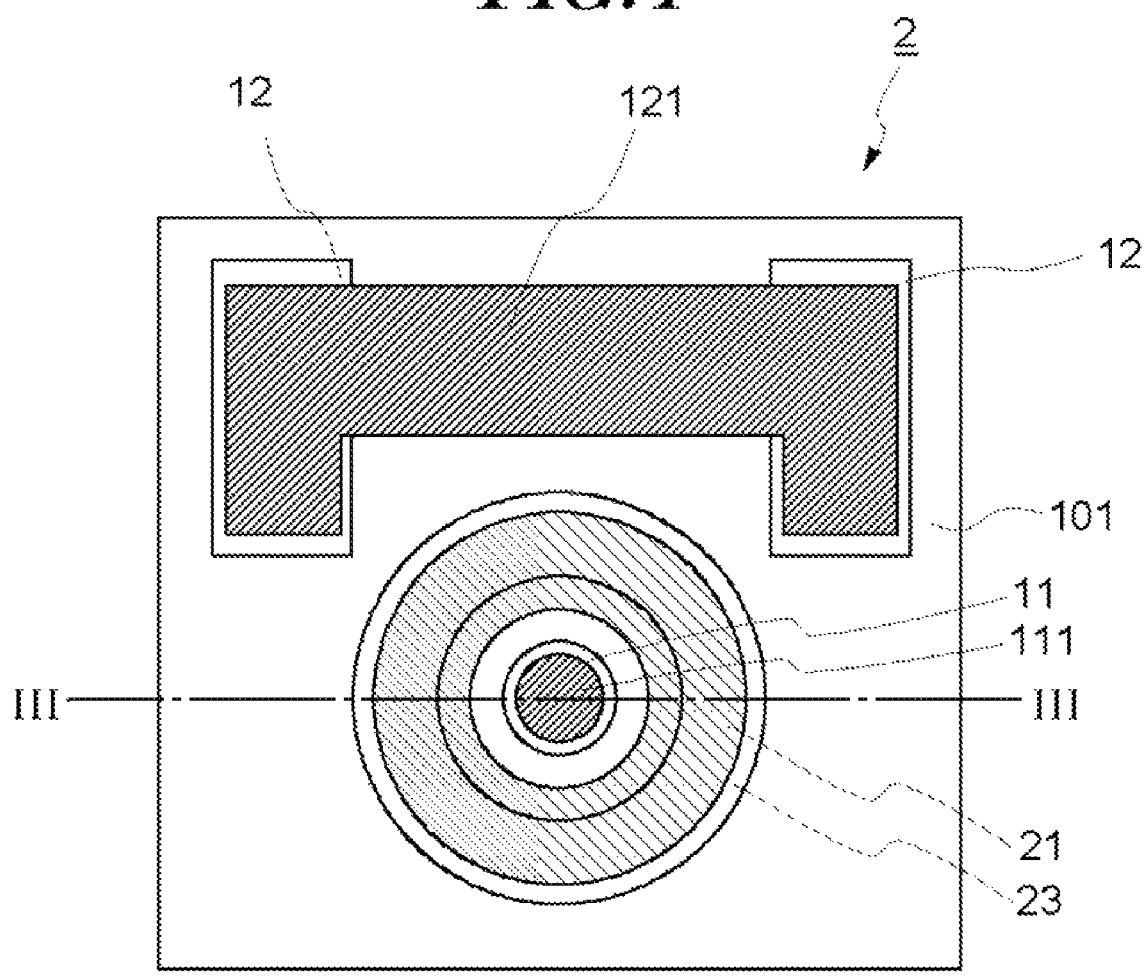
FIG. 4 is a plane view illustrating a light-receiving device according to a second exemplary embodiment.
Figure 5:
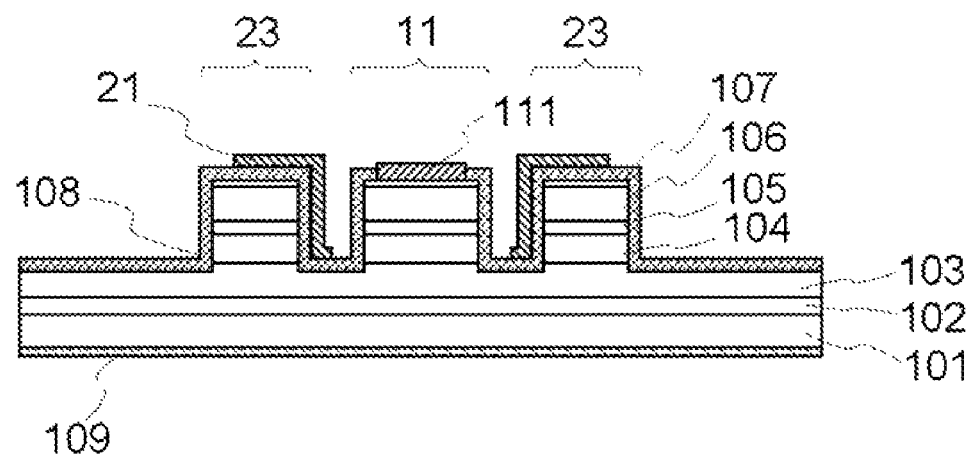
FIG. 5 is a sectional view taken in III-III direction of FIG. 4.

FIG. 4 is a plane view of light-receiving device 2, and FIG. 5 is a sectional view taken in III-III direction of FIG. 4.

As illustrated in FIGS. 4 and 5, light-receiving device 2 of this exemplary embodiment is different from that of the first exemplary embodiment in that light shielding layer 21 formed of a material capable of shielding or reflecting scattered light, e.g. an electrode metal is formed from a top portion of third mesa 23 to a side face of first mesa 11. Light-receiving device 2 is identical to that of the first exemplary embodiment in the other aspects.

Light-receiving device 2 will be explained in detail.

Light-receiving device includes first mesa 11 and second mesa 12 identical to those of the above exemplary embodiment. In addition, light-receiving device 2 includes third mesa 23.

Third mesa 23 is approximately identical in construction to third mesa 13 of the above exemplary embodiment, but different from third mesa 13 in that it has light shielding layer 21 on a top portion (on protection film 108) and side face (on protection film 108).

Here, light shielding layer 21 of third mesa 23 is formed on protection film 108, and is not in contact with p-side electrode 111 or n-side electrode 121.

In this exemplary embodiment, although light shielding layer 21 is formed on the side face of third mesa 23 between first mesa 11 and third mesa 23, it may be formed on an opposite side face. Also, it is preferable to form light shielding layer 21 to a groove bottom portion between first mesa 11 and third mesa 23.

Next, a method for manufacturing light-receiving device 2 will be explained.

First of all, as in the above exemplary embodiment, buffer layer 102, filter layer 103, multiplication layer 104, electric field mitigation layer 105, light absorption layer (light-receiving region) 106 and contact layer 107 are successively stacked on semiconductor substrate 101, and first mesa 11, second mesa 12 and third mesa 23 are formed. Thereafter, protection film 108 is formed.

In addition, as in the above exemplary embodiment, protection film 108 is selectively etched, then p-side electrode 111 and n-side electrode 121 are formed.

When p-side electrode 111 is formed, light shielding layer 21 is formed on a top portion and side face of third mesa 23 where protection film 108 has been positioned, and a groove bottom portion between first mesa 11 and third mesa 23.

This exemplary embodiment can manifest approximately identical effects to those of the above exemplary embodiment, and even better effects.

In this exemplary embodiment, light shielding layer 21 is formed from the top portion of third mesa 23 to the groove bottom portion between first mesa 11 and third mesa 23.

Accordingly, since light shielding layer 21 can shield or reflect light which was not absorbed by filter layer 103 or light absorption layer 106 of the third mesa but transmitted, it can more contribute to restriction of crosstalk.

Third Exemplary Embodiment

The third exemplary embodiment will be explained with reference to FIGS. 6 and 7.

Figure 6:
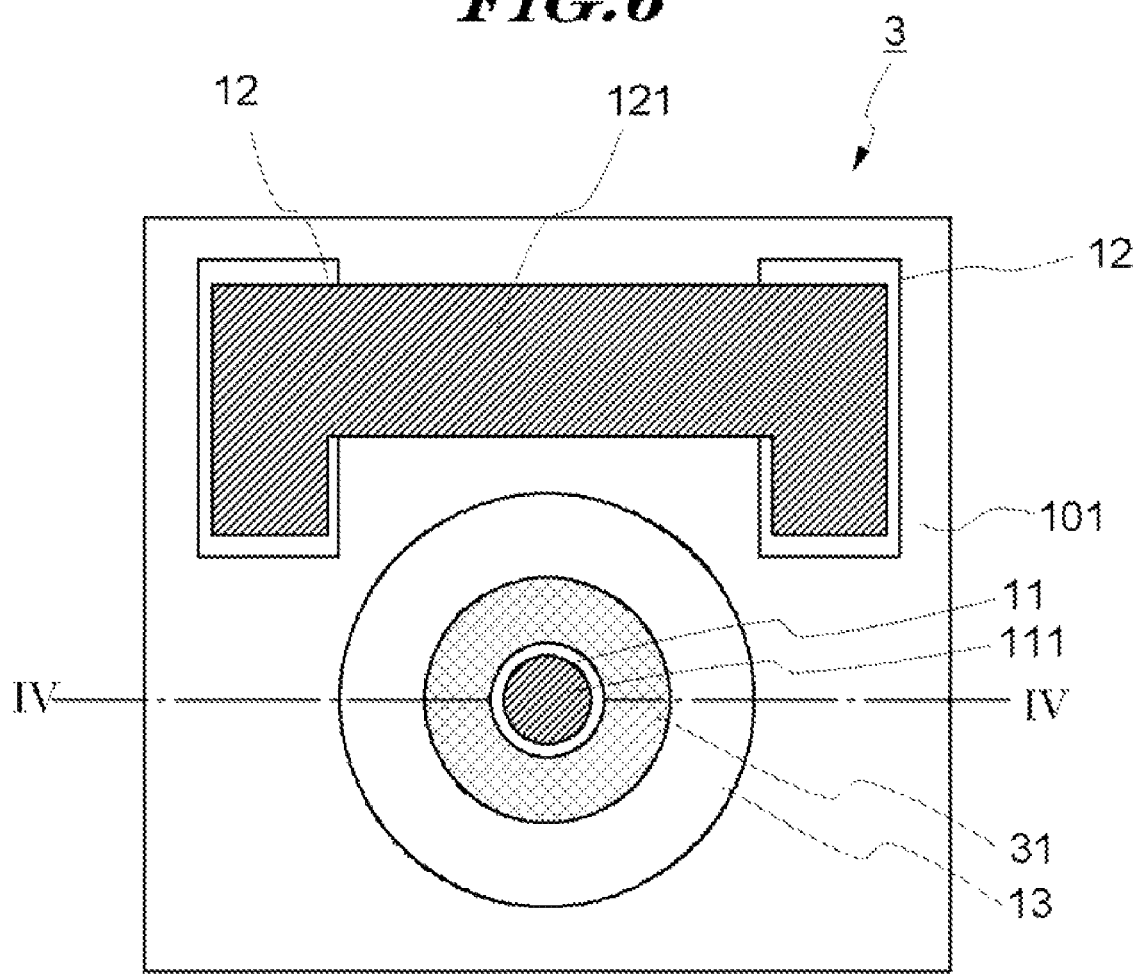
FIG. 6 is a plane view illustrating a light-receiving device according to a third exemplary embodiment.
Figure 7:
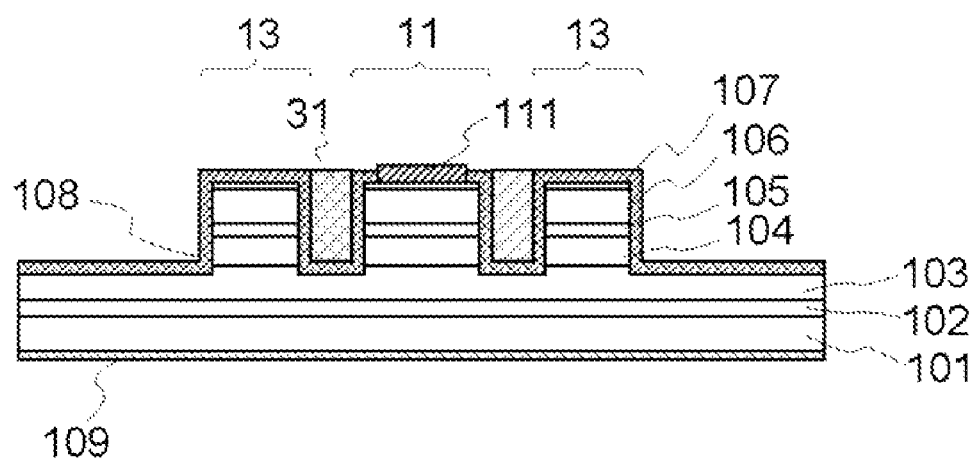
FIG. 7 is a sectional view taken in IV-IV direction of FIG. 6.
Figure 8:
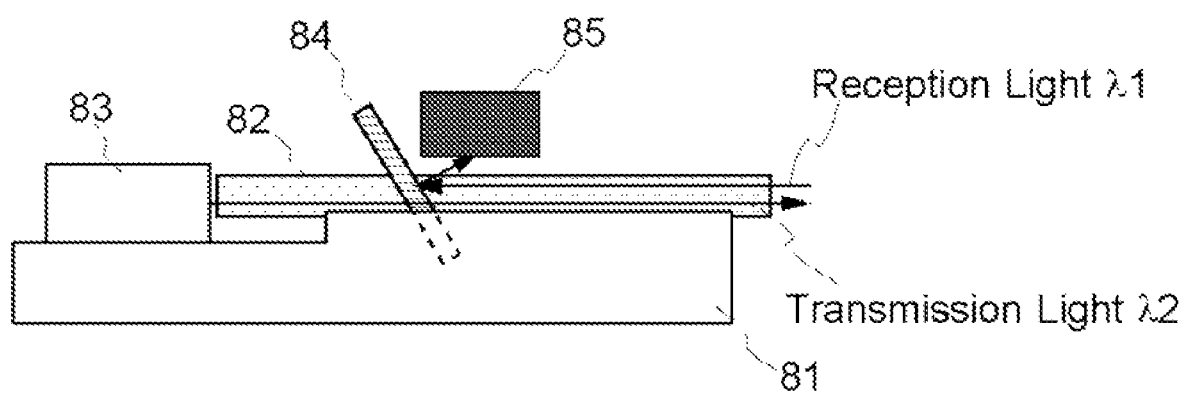
FIG. 8 is a conceptual construction view of a conventional bidirectional optical communication module integrated on a platform.

FIG. 6 is a plane view of light-receiving device 3, and FIG. 7 is a sectional view taken in IV-IV direction of FIG. 6.

As illustrated in FIGS. 6 and 7, light-receiving device 3 of this exemplary embodiment is different from that of the first exemplary embodiment in that an insulation material capable of absorbing or reflecting light, e.g. a resin such as poly-benzo-cyclo-butene (BCB) is filled between first mesa 11 and third mesa 13.

Light-receiving device 3 is identical to that of the first exemplary embodiment in the other aspects.

Light-receiving device 3 will be explained in detail.

Light-receiving device 3 includes first mesa 11, second mesa 12 and third mesa 13 identical to those of the above exemplary embodiment.

Insulation material 31 capable of absorbing or reflecting scattered light or light disturbing the reception is filled between first mesa 11 and third mesa 13 where protection film 108 has been positioned. Here, insulation material 31 is preferably transparent to light to be received. However, the present invention is not limited thereto.

Next, a method for manufacturing light-receiving device 3 will be explained.

First of all, as in the above exemplary embodiment, buffer layer 102, filter layer 103, multiplication layer 104, electric field mitigation layer 105, light absorption layer (light-receiving region) 106 and contact layer 107 are successively stacked on semiconductor substrate 101, and first mesa 11, second mesa 12 and third mesa 13 are formed. Thereafter, protection film 108 is stacked.

In addition, as in the above exemplary embodiment, protection film 108 is selectively etched, then p-side electrode 111 and n-side electrode 121 are formed.

Insulation material 31 capable of absorbing or reflecting scattered light is filled between first mesa 11 and third mesa 13.

This exemplary embodiment can manifest approximately identical effects to those of the above exemplary embodiment, and even better effects.

In this exemplary embodiment, insulation material 31 capable of absorbing or reflecting scattered light is filled between first mesa 11 and third mesa 13.

Accordingly, since insulation material 31 can absorb or reflect light which was not absorbed by filter layer 103 or light absorption layer 106 of the third mesa but transmitted, it can more contribute to restriction of crosstalk.

While the present invention has been described in connection with the exemplary embodiments, the present invention is not limited thereto. Therefore, it will be understood by those skilled in the art that various modifications and changes can be made to the construction or details of the present invention within the scope of the present invention.

Also, in each exemplary embodiment, although second mesa 12 is arranged in a plural number, the present invention is not limited thereto. A single second mesa may be used. In addition, if flip chip mounting is not necessary, the second mesa may be omitted.

Moreover, light-receiving devices 1, 2 and 3 of the respective exemplary embodiments are avalanche photodiodes. However, the present invention is not limited thereto. Any of light-receiving devices having at least a first mesa and a third mesa may be used.

The invention claimed is:

1. A semiconductor light-receiving device, comprising:
a semiconductor substrate; and
a first conductive type semiconductor layer, a second conductive type semiconductor layer including at least a light absorption layer, a first conductive type electrode formed on the first conductive type semiconductor layer, and a second conductive type electrode formed on the second conductive type semiconductor layer, which are formed on the semiconductor substrate, and
signal light incident from the semiconductor substrate being absorbed by the light absorption layer and converted into an electric signal,
wherein the semiconductor light-receiving device comprises a filter layer arranged between the semiconductor substrate and the light absorption layer, and formed of a semiconductor layer having a shorter absorption edge wavelength than that of the light absorption layer,
the second conductive type electrode is formed on a first mesa where a semiconductor layer on the filter layer is formed in a mesa structure, and
the semiconductor light-receiving device comprises a third mesa surrounding the first mesa, disposed spaced apart from the first mesa, and absorbing disturbance light to the signal light to be received by at least the light absorption layer.

2. The semiconductor light-receiving device according to claim 1, wherein the first conductive type electrode is extended and formed on a second mesa formed outside the third mesa with respect to the first mesa.

3. The semiconductor light-receiving device according to claim 1, wherein the third mesa has the same semiconductor layer structure as that of the first mesa.

4. The semiconductor light-receiving device according to claim 1, wherein the third mesa is formed including a semiconductor layer having a shorter absorption edge wavelength than that of the light absorption layer.

5. The semiconductor light-receiving device according to claim 1, wherein a light shielding film is formed on a sidewall of the third mesa.

6. The semiconductor light-receiving device according to claim 1, wherein an insulation film for absorbing or reflecting light incident on the first mesa through the third mesa is filled in a gap between the first mesa and the third mesa.

7. The semiconductor light-receiving device according to claim 2, wherein the third mesa has the same semiconductor layer structure as that of the first mesa.

8. The semiconductor light-receiving device according to claim 2, wherein the third mesa is formed including a semiconductor layer having a shorter absorption edge wavelength than that of the light absorption layer.

9. The semiconductor light-receiving device according to claim 2, wherein a light shielding film is formed on a sidewall of the third mesa.

10. The semiconductor light-receiving device according to claim 2, wherein an insulation film for absorbing or reflecting light incident on the first mesa through the third mesa is filled in a gap between the first mesa and the third mesa.

11. The semiconductor light-receiving device according to claim 3, wherein a light shielding film is formed on a sidewall of the third mesa.

12. The semiconductor light-receiving device according to claim 3, wherein an insulation film for absorbing or reflecting light incident on the first mesa through the third mesa is filled in a gap between the first mesa and the third mesa.

13. The semiconductor light-receiving device according to claim 4, wherein a light shielding film is formed on a sidewall of the third mesa.

14. The semiconductor light-receiving device according to claim 4, wherein an insulation film for absorbing or reflecting light incident on the first mesa through the third mesa is filled in a gap between the first mesa and the third mesa.

15. The semiconductor light-receiving device according to claim 7, wherein a light shielding film is formed on a sidewall of the third mesa.

16. The semiconductor light-receiving device according to claim 7, wherein an insulation film for absorbing or reflecting light incident on the first mesa through the third mesa is filled in a gap between the first mesa and the third mesa.

17. The semiconductor light-receiving device according to claim 8, wherein a light shielding film is formed on a sidewall of the third mesa.

18. The semiconductor light-receiving device according to claim 8, wherein an insulation film for absorbing or reflecting light incident on the first mesa through the third mesa is filled in a gap between the first mesa and the third mesa.

* * * * *